US008062919B2

(12) United States Patent
Apsel et al.

(10) Patent No.: US 8,062,919 B2
(45) Date of Patent: Nov. 22, 2011

(54) MONOLITHIC SILICON-BASED PHOTONIC RECEIVER

(75) Inventors: Alyssa B. Apsel, Ithaca, NY (US); Anand M. Pappu, Ithaca, NY (US); Cheng Po Chen, Ithaca, NY (US); Tao Yin, San Jose, CA (US)

(73) Assignee: Cornell Research Foundation, Inc., Ithaca, NY (US)

( * ) Notice: Subject to any disclaimer, the term of this patent is extended or adjusted under 35 U.S.C. 154(b) by 345 days.

(21) Appl. No.: 11/837,222

(22) Filed: Aug. 10, 2007

(65) Prior Publication Data
US 2008/0054391 A1    Mar. 6, 2008

Related U.S. Application Data

(60) Provisional application No. 60/837,443, filed on Aug. 11, 2006.

(51) Int. Cl.
*H01L 21/00* (2006.01)
(52) U.S. Cl. ............ 438/59; 257/257; 257/431; 257/462
(58) Field of Classification Search ........... 257/E31.049, 257/E31.111, 149, 151, 291, 293, 257, 431, 257/462; 438/59
See application file for complete search history.

(56) References Cited

U.S. PATENT DOCUMENTS

| 6,583,445 | B1 | 6/2003 | Reedy et al. ..................... 257/82 |
| 6,720,830 | B2 | 4/2004 | Andreou et al. ............. 330/253 |
| 2006/0097777 | A1* | 5/2006 | Reynolds ....................... 327/551 |
| 2007/0105274 | A1 | 5/2007 | Fitzgerald ...................... 438/107 |

FOREIGN PATENT DOCUMENTS

| WO | WO 02/49120 | * 6/2002 |
| WO | WO 2007/053686 | 5/2007 |

OTHER PUBLICATIONS

Wikipedia the free encyclopedia Definition of Bi CMOS.*
Wikipedia the free encyclopdia Definition of Bi CMOS. Assumed to be dated at least one yar prior to applicant's invention but actual date is unknown.*
Ahn, D. et al. High performance, waveguide integrated Ge photodetectors. Optics Express 15(7), Apr. 2007, 3916-3921.
Apsel, A. et al. Integrated Optoelectronic Receivers for Intra-Chip Communication. Frontiers in Optics (formerly the Annual Mtg. of the OSA), Oct. 2005, 1-2.
Apsel, A. et al. Merging Traditional VLSI with Photonics. IEEE LTIMC Conference, Oct. 2004, 91-99..
Chandrasekhar, S. et al. Demonstration of Enhanced Performance of an InP/InGaAs Heterojunction Phototransistor with a Base Terminal. IEEE Elect. Dev. Ltrs. 12(10), Oct. 1991, 550-552.

(Continued)

*Primary Examiner* — Michael Shingleton
(74) *Attorney, Agent, or Firm* — Burns & Levinson LLP; Orlando Lopez

(57) ABSTRACT

An integrated circuit, and method for manufacturing the integrated circuit, where the integrated circuit can include a phototransistor comprising a base having a SiGe base layer of a predetermined germanium composition and a thickness of more than 65 nm and less than about 90 nm. The integrated circuit can further include a transimpedance amplifier (TIA) receiving an output from the phototransistor. The phototransistor and the TIA can be built on a silicon substrate.

11 Claims, 18 Drawing Sheets

OTHER PUBLICATIONS

Chen, H.R. et al. The Effect on Base Bias for InGaP/GaAs Heterojunction Phototransitors. Conf. on Optoelect. & Microelect. Mat. & Dev., Dec. 2004, 241-244.

Chen, P.C.P. et al. Monolithic Integrated SiGe Optical Receiver and Detector. CLEO/QLES Conference (May 2007), PhAST Conference (May 2007), 1-2.

Eg&G Optoelectronics. Typical Applications for Phototransistors and IREDs. Retrieved from http://www.engr.udayton.edu/faculty/jloomis/ece445/topics/egginc/pt_app.html on Aug. 9, 2007. Copyright ©1997 EG&G, Inc. Legal Notices.

Fairchild Semiconductor. Application Note An-3005: Design Fundamentals for Phototransistor Circuits. Rev. 4.00 Apr. 30, 2002. ©2002 Fairchild Semiconductor Corp.

Harame, D.L. et al. Si/SiGe Epitaxial-Base Transistors—Part II: Process Integration and Analog Applications. IEEE Trans. Elect. Dev. 42(3), Mar. 1995, 469-482.

Kamitsuna, H. Ultra-Wideband Monolithic Photoreceivers Using HBT-Compatible HPT's with Novel Base Circuits, and Simultaneously Integrated with an HBT Amplifier. J. Lightwave Tech. 13(12) Dec. 1995, 2301-2307.

Kimerling, L.C. et al. Electronic-photonic integrated circuits on the CMOS platform. Proceedings of the SPIE 6125, 2006, 6-15.

Kromer, C. et al. A Low-Power 20 GHz 52-dBΩ) Transimpedance Amplifier in 80-nm CMOS. IEEE J. Solid-State Circ. 39(6), Jun. 2004, 885-894.

Lai, K-S et al. A Novel High Performance Integrated Phototransistor Photodetector (PTPD) in Standard SiGe BiCMOS Technology. International Semiconductor Device Research Symposium, Dec. 2005, 17-18.

Pappu, A. M. et al. A low-voltage supply optoelectronic detector-receiver in a commercial silicon-based process. ISCAS 2006, 5475-5478.

Pappu, A. M. Short Distance Optical Links: Analysis, Demonstration and Circuit Design. Dissertation, Cornell University, Aug. 2006, 1-136.

Research. © 2006 Optoelectronic VLSI Laboratory of Cornell University. Last modified Apr. 18, 2007. Available at http://oevlsi.ece.cornell.edu.

Selavo, L. et al. Design and Fabrication of SiGe Photo-Detectors in the IBM 5HP Process. Proc. Top. Mtg. Optics in Comp. Apr. 2004, 41-42. Available at http://kona.ee.pitt.edu/research-opto.html.

Song, I. Multi-Gbit/s CMOS Transimpedance Amplifier with Integrated Photodetector for Optical Interconnects. Ph.D. Thesis, Georgia Inst. of Tech., Nov. 2004, 1-162.

Sridhara, R. et al. Performance Enhancement of GaInP/GaAs Heterojunction Bipolar Phototransistors Using DC Base Bias. J. Lghtwv. Tech. 16(6), Jun. 1998, 1101-1106.

Yin, T. et al. Low-Cost, High Efficiency, and High-Speed SiGe Phototransistors in Commercial BiCMOS. IEEE Phot. Tech. Ltrs. 18(1), Jan. 1, 2006, 55-57.

Yin, T. et al. Optical Interconnects in Commercial BiCMOS. SPIE Photonics West, Feb. 2004, 1-10.

U.S. Provisional Patent Application U.S. Appl. No. 60/837,443, filed Aug. 11, 2006. Monolithic silicon-based photoic receiver. A. Apsel et al., Applicants.

U.S. Provisional Patent Application U.S. Appl. No. 60/732,442, filed Nov. 1, 2005. Integrated Light Arrays. E. Fitzgerald, Applicant.

U.S. Provisional Patent Application U.S. Appl. No. 60/790,204, filed Apr. 7, 2006. Integrated visible light-emitter arrays on Si. E. Fitzgerald, Applicant.

* cited by examiner

MONOLITHIC SILICON-BASED PHOTONIC RECEIVER

CROSS REFERENCE TO RELATED APPLICATIONS

This application claims priority under 35 U.S.C. §119 from Provisional Application Ser. No. 60/837,443 entitled MONOLITHIC SILICON-BASED PHOTOIC RECEIVER, filed on Aug. 11, 2006, incorporated by reference in its entirety herein.

BACKGROUND

Fusing the advantages of optics with electronics promises a number of advantages in VLSI systems. While there are fundamental advantages to using opto-electronic systems, industry acceptance of such systems depends on their cost-benefits relative to fully electrical systems. If the cost of optoelectronic systems is high, their usage will be restricted to niche applications.

Industry leaders, however, expect to use optical boards for their processors in the future. They expect that the future data rates will make electrical board signaling very costly, since it will require increased trace thickness, using exotic substrates with lower dielectric loss tangents, employing differential signaling techniques or more sophisticated transmitters and receivers. All these potential solutions are costly, and make optical interconnect technology an increasingly attractive alternative.

Optical interconnect technology still poses its own cost problems in short-distance applications. This technology depends largely on components made of gallium-arsenide and germanium, which are more expensive than silicon. These components are then integrated with silicon systems using hybrid integration techniques, such as wire bonding, flip-chip bonding and wafer bonding.

Wire-bonding, the simplest of all the hybrid techniques, involves connecting the photodetector chip and the receiver chip with physical wires after fabrication. Wire-bonding thus involves post-fabrication steps leading to an increase in cost and design time. Wire-bonding adds additional parasitic effects, in the form of bond-wire inductance and pad capacitance, and constrains the design of opto-electronic systems. Since wire-bonding pads need to be allocated space on chip, the number of input/output signals is limited.

Detector and receiver chips 3 can be flip-bonded, as shown in FIG. 1 (Prior Art), to eliminate wiring and therefore eliminate the parasitic effects. This technique is efficient only if the receiver/detector substrate is transparent to the light incident on the detector. Otherwise, it requires costly procedures to thin the substrate and make it transparent to the wavelength of light being used. This technique, like wire bonding requires post-fabrication steps. This, along with the precision required in flip bonding, makes the technique costly.

With wafer-bonding, it is possible to bond detector and receiver wafers together. Recent advances in this technology include i) sequential processing, which involves single crystal growth and transfer and ii) parallel processing, which involves fabricating separate wafers and transferring the thinned donor layer. Sequential processing causes degradation of the performance of the lower layers due to thermal cycling. Parallel processing involves issues of reliable thinned wafer transfer. These techniques are still at research stage and are not expected to be low cost. Since these hybrid techniques can be cost-intensive and are not expected to become less expensive, current research is focused on ways to make photodetectors in silicon, eliminating hybrid integration. Constructing opto-electronic systems in silicon can also provide a number of advantages including mature fabrication techniques, ease of design and verification, and, as in the electronics case, improved yields.

With respect to silicon-based photodetectors, in order to improve the bandwidth-efficiency of silicon detectors, either a large on-chip photodiode bias voltage or non-standard processing techniques can be used. Silicon p-n and p-i-n photodiodes can have response time issues due to the long absorption depth at 850 nm. Large bias voltages can improve the carrier velocity, and hence, the response time. However, using an additional power supply voltage can involve additional cost, possibly offsetting any cost benefits that might be incurred from integrating detectors in silicon. Non-standard processing, like using deep trenches, thicker active layer SOI substrates, and fully depleted SIMOX substrates, can restrict the detector applications since they may not be compatible with the logic process fabrication.

A disadvantage of silicon for IR detectors at 850 nm wavelength light has been the long absorption length (¼ 20 µm) required for high responsivity. The thickness of these detectors can degrade bandwidth due to both parasitic effects and carrier transport mechanisms and can make high speed operation with good responsivity a challenge.

SUMMARY

In one embodiment, the present teachings relate to an integrated circuit and the manufacture of an integrated circuit in which a phototransistor and a TIA are coupled, and in which the phototransistor has a base layer with certain characteristics. The inherent gain in the HBT device allows a boost in responsivity without fabrication of a thick device.

For a better understanding of the present embodiment, together with other and further objects thereof, reference is made to the accompanying drawings and detailed description. The scope of the present embodiment is pointed out in the appended claims.

BRIEF DESCRIPTION OF THE DRAWINGS

The embodiments herein are illustratively described in reference to the appended drawings in which.

DETAILED DESCRIPTION OF THE ILLUSTRATIVE EMBODIMENTS

The present teachings are now described more fully hereinafter with reference to the accompanying drawings, in which the illustrative embodiment of the present teachings is shown. The following configuration description is presented for illustrative purposes only.

Photodetectors, of the present teachings, have been developed utilizing conventional bipolar junction transistors and complementary metal oxide semiconductor (CMOS) technology (BiCMOS). Through a modification of the layers used in making a SiGe Heterojunction bipolar junction transistor (BJT) (HBT) and removal of silicide layers, a phototransistor can be constructed. "Si/SiGe Epitaxial-Base Transistors-Part II: Process Integration and Analog Applications," (*IEEE Transactions on Electron Devices*, vol. 42, pp. 469-482, March 1995), incorporated herein in its entirety by reference, provides a description of SiGe processing and the layers involved. The integrated detector can use a single low power supply (1.8V) and a standard commercial manufacturing technology, thereby reducing costs while keeping the detector compatible with CMOS fabrication.

Figure 1:
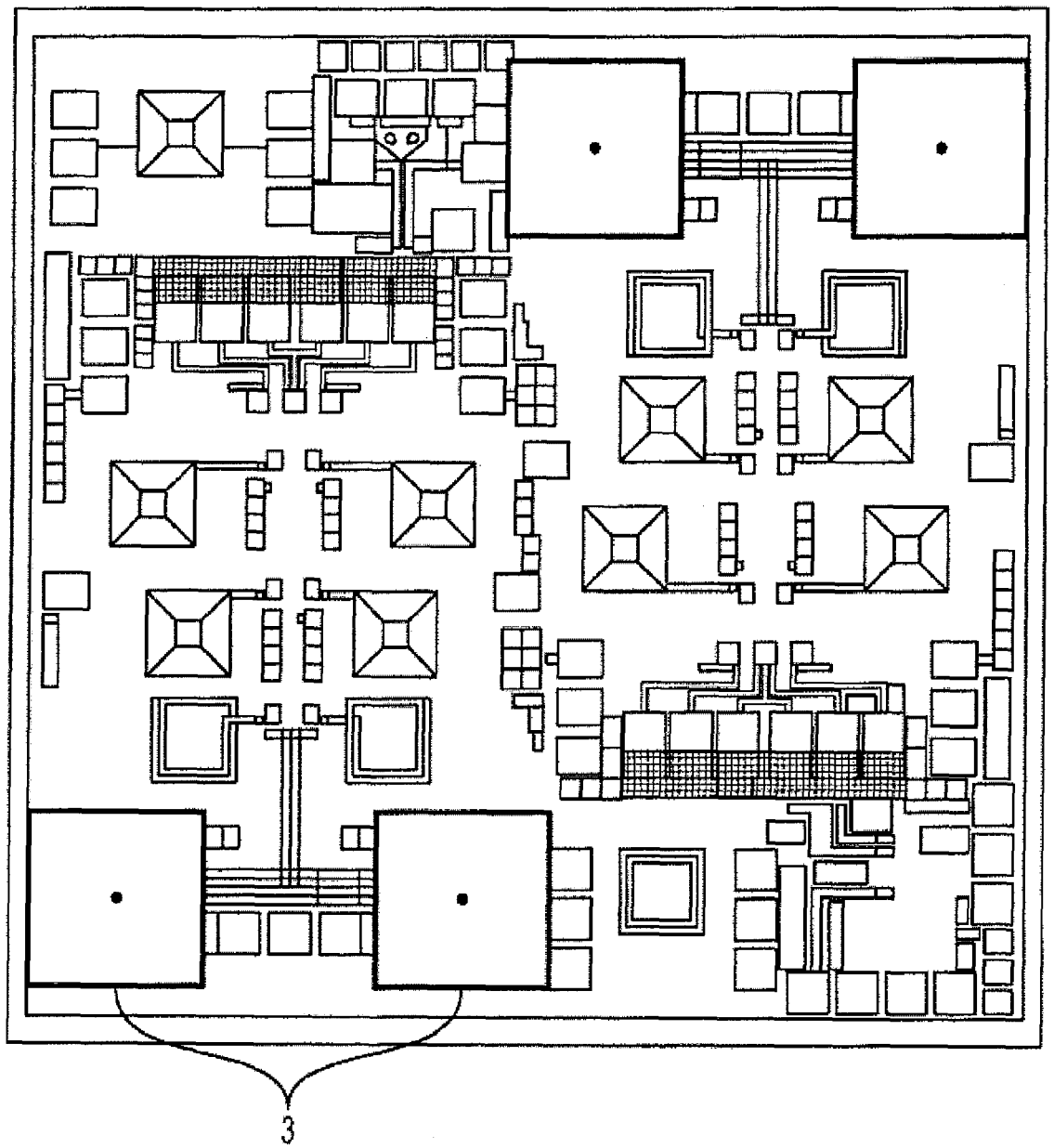
FIG. 1 (Prior Art) is a pictorial representation of a Silicon-on-Sapphire chip with flip-bonded detectors facing downwardly.
Figure 2:
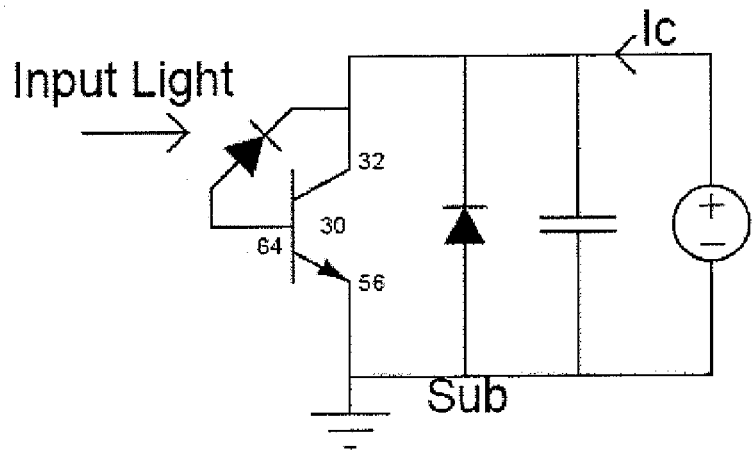
FIG. 2 is a schematic diagram of a phototransistor.

FIG. 2 shows the schematic of phototransistor 30 in a base-open configuration. Collector 32 is biased with a voltage source. With no light incident on phototransistor 30, current through collector 32 consists of the leakage current of the reverse-biased collector-substrate junction and the off current of phototransistor 30.

Figure 3:
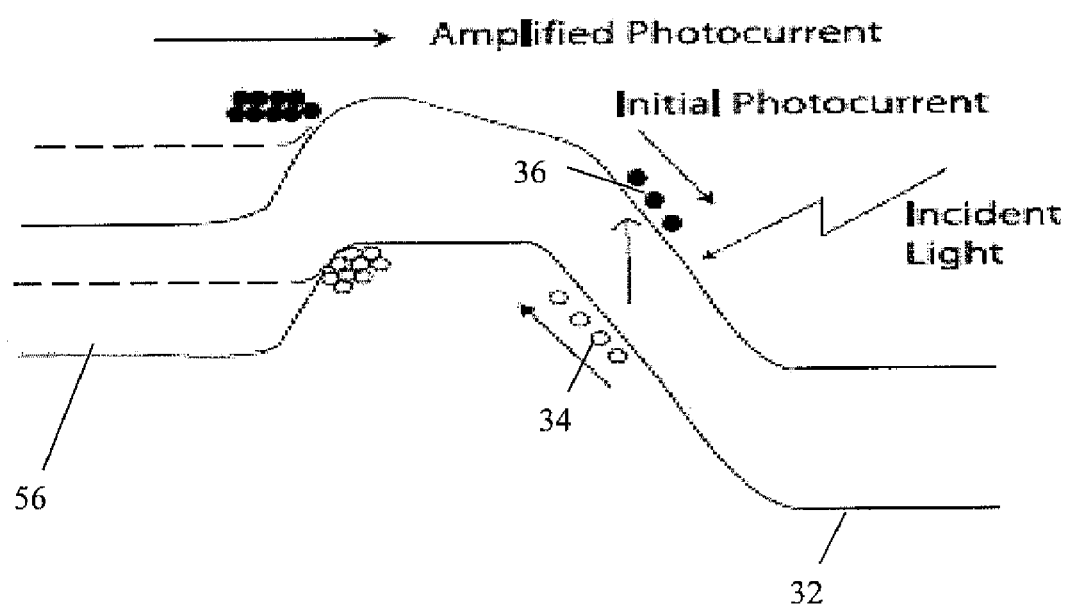
FIG. 3 is a schematic diagram of a band diagram and carrier generation mechanism of the phototransistor of FIG. 2.

Referring now to FIG. 3, a schematic of the band diagram and the carrier generation mechanism is shown. BJTs available in IBM's BiCMOS6HP technology are heterojunction devices. The BJT base can be graded with germanium from an emitter to collector. When light is incident on phototransistor 30, photon-generated carriers in different layers of phototransistor 30 (FIG. 2) contribute to the photocurrent differently. Absorption in emitter 56 may not contribute much to the photocurrent as photo-generated carriers may quickly recombine. Holes 34 generated in the reverse biased base-collector p-n junction drift towards base 64 (FIG. 2) and lead to a lower base-emitter junction barrier height. With this, electrons 36 from emitter 56 flow to collector 32 after crossing base 64. This BJT action leads to amplification of photon-generated holes 34 in the base-collector junction. For a SiGe base layer with 20% Ge composition, the absorption length at 850 nm reduces to 10 μm. Though only a thin base layer of 60-90 nm (greater than 65 nm and less than or equal to about-90 nm, in one instance) is grown in the transistor, the slightly enhanced SiGe response can be amplified by the current gain that can be as high as one hundred. Photon absorption in collector 32 and substrate contributes to the photo-current, but there is no current gain involved with this generated current.

Figure 4:
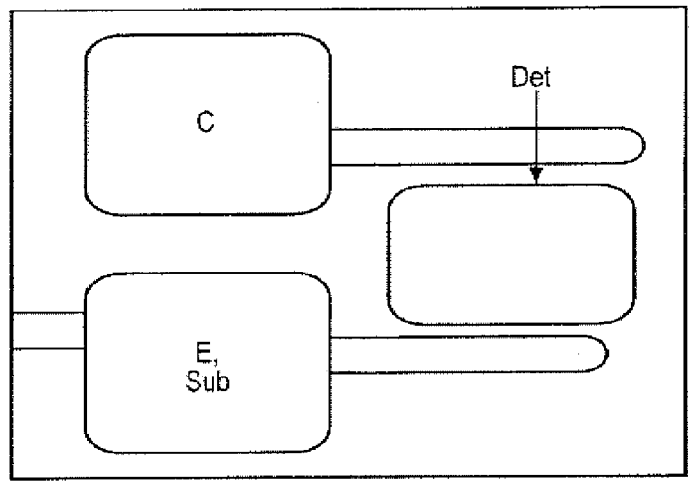
FIG. 4 is a photograph of a chip with an 80 µm×100 µm detector having a base-open configuration.

Referring now to FIG. 4, a chip picture of an 80 μm×100 μm detector in a base-open configuration is shown. The contact metal in the HBT is routed around the device to form an optical window for light absorption.

Figure 5:
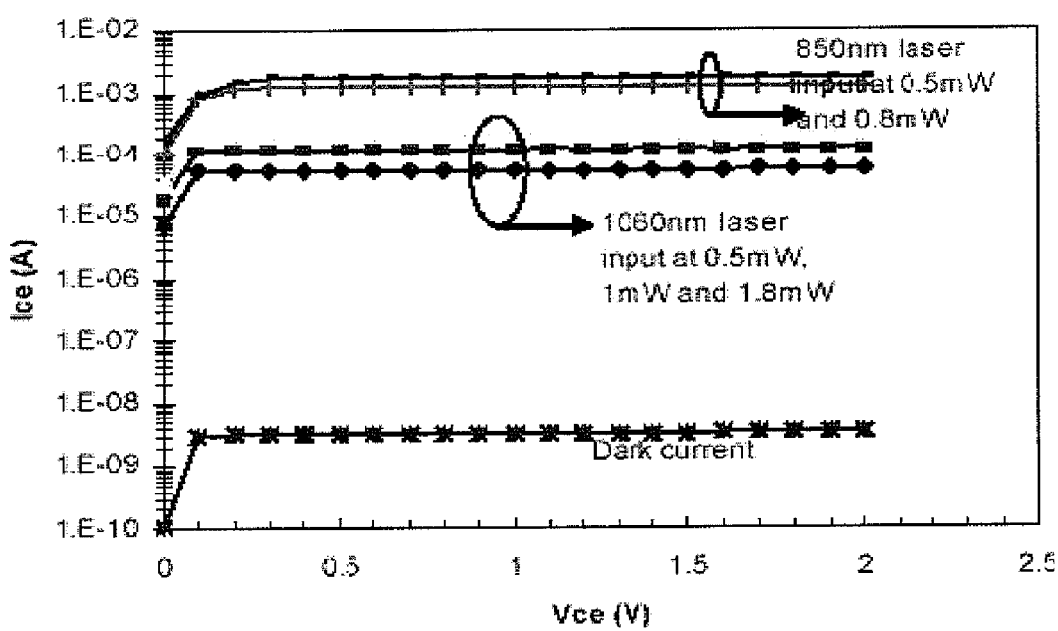
FIG. 5 is a chart showing the responsivity of a 43 µm×51 µm detector to 850 nm and 1060 nm wavelength light.

Referring now to FIG. 5, the responsivity of a 43 μm×51 μm detector to 850 nm and 1060 nm wavelength light is shown. There is a responsivity of 2.4 A/W for 850 nm wavelength and 0.12 A/W for 1060 nm wavelength. The greater responsivity of the detector at 850 nm is due to the smaller absorption depth in silicon. At 1060 nm wavelength, silicon absorption coefficient is significantly smaller and an increased percentage of the photocurrent comes from the absorption of the SiGe base layer. The minimum bias voltage on collector 32 (FIG. 2) to operate phototransistor 30 (FIG. 2) in saturation is 0.2V. This low voltage can make phototransistor 30 extremely suitable for integration with on-chip receiver circuitry.

Figure 6:
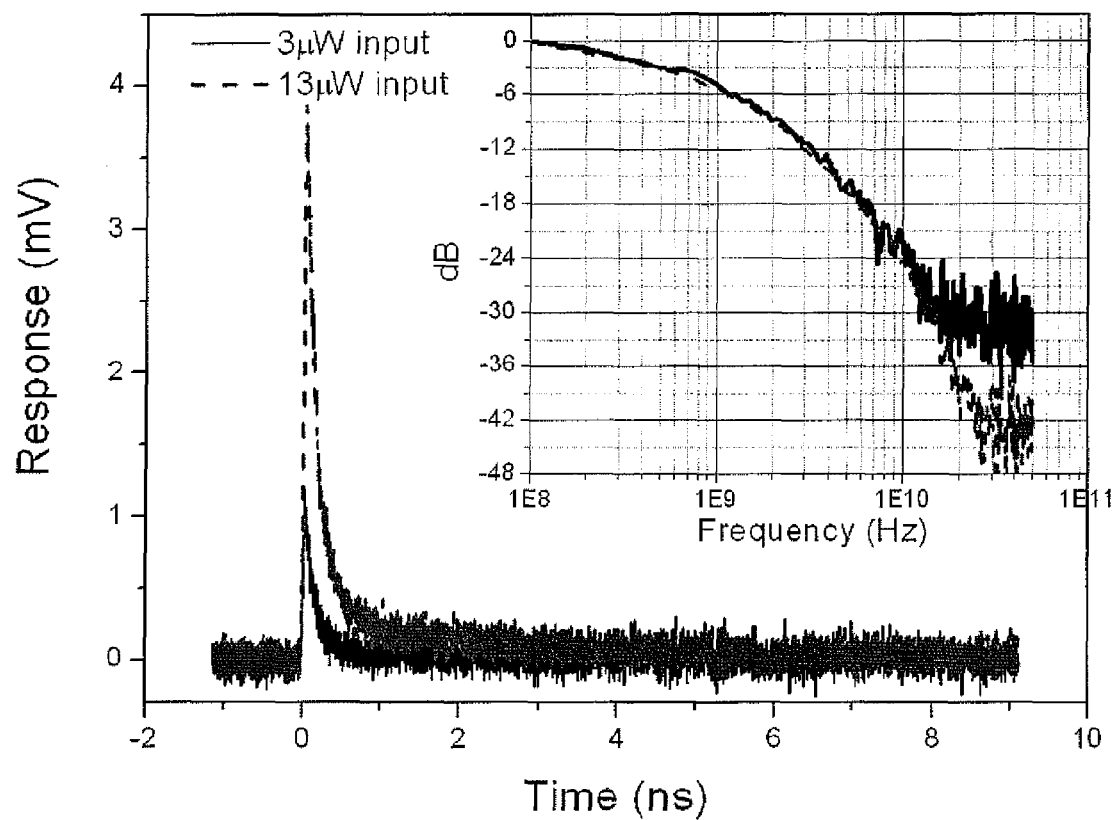
FIG. 6 is a chart showing the measured impulse response of a 10 µm×16 µm phototransistor.

With respect to FIG. 6, the measured impulse response of a 10 μm×16 μm phototransistor is shown. A measured bandwidth of around 500 MHz can be obtained with this detector size. This frequency response can be further improved by using the phototransistor in a common-emitter mode with base biasing. These phototransistors can operate with bandwidths in excess of 5 GHz with base-current biasing. Biasing base 64 (FIG. 2) can move phototransistor 30 (FIG. 2) into a high-fT region and can improve the bandwidth. Using a smaller size detector can also decrease the capacitance and can improve the bandwidth.

Figure 7:
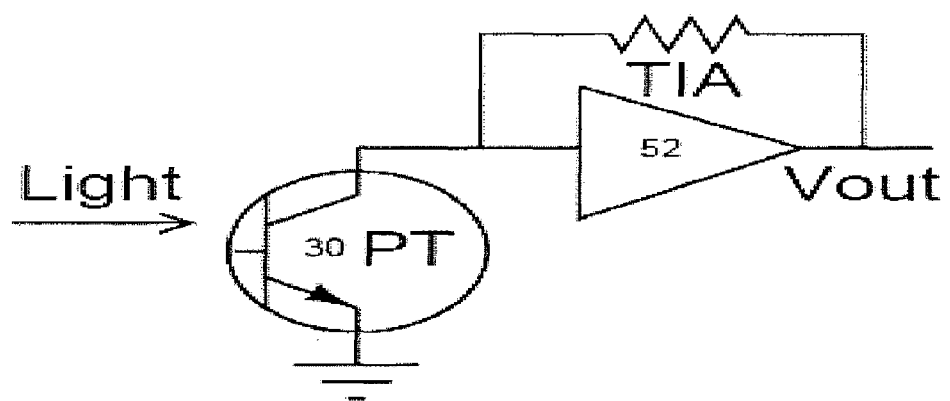
FIG. 7 is a block diagram of an integrated optical receiver.
Figure 8:
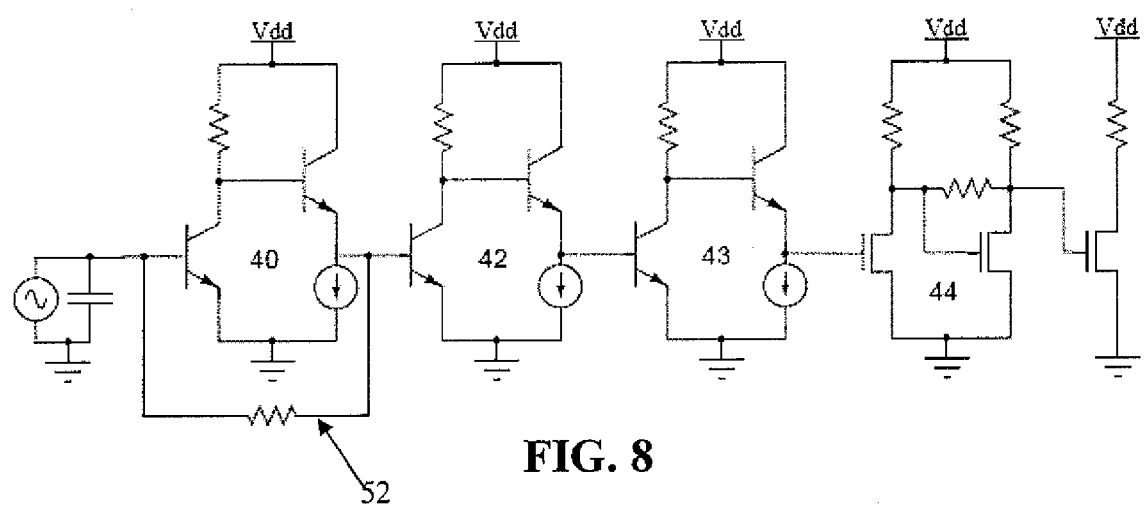
FIG. 8 is a schematic diagram of a 3.5 Gbps receiver.

Referring now to FIG. 7, a block diagram of a receiver is shown. The detector described above can be integrated with a transimpedance amplifier (TIA) 52 (FIG. 8). Since this detector can be fully compatible with logic fabrication, and can use a low voltage supply, the main hurdle in integrating it with a TIA lies in the TIA design. It is expected that the detector will work around 1 Gbps with the present design, so a receiver with bandwidth in excess of 1 Gbps is desired.

Figure 9:
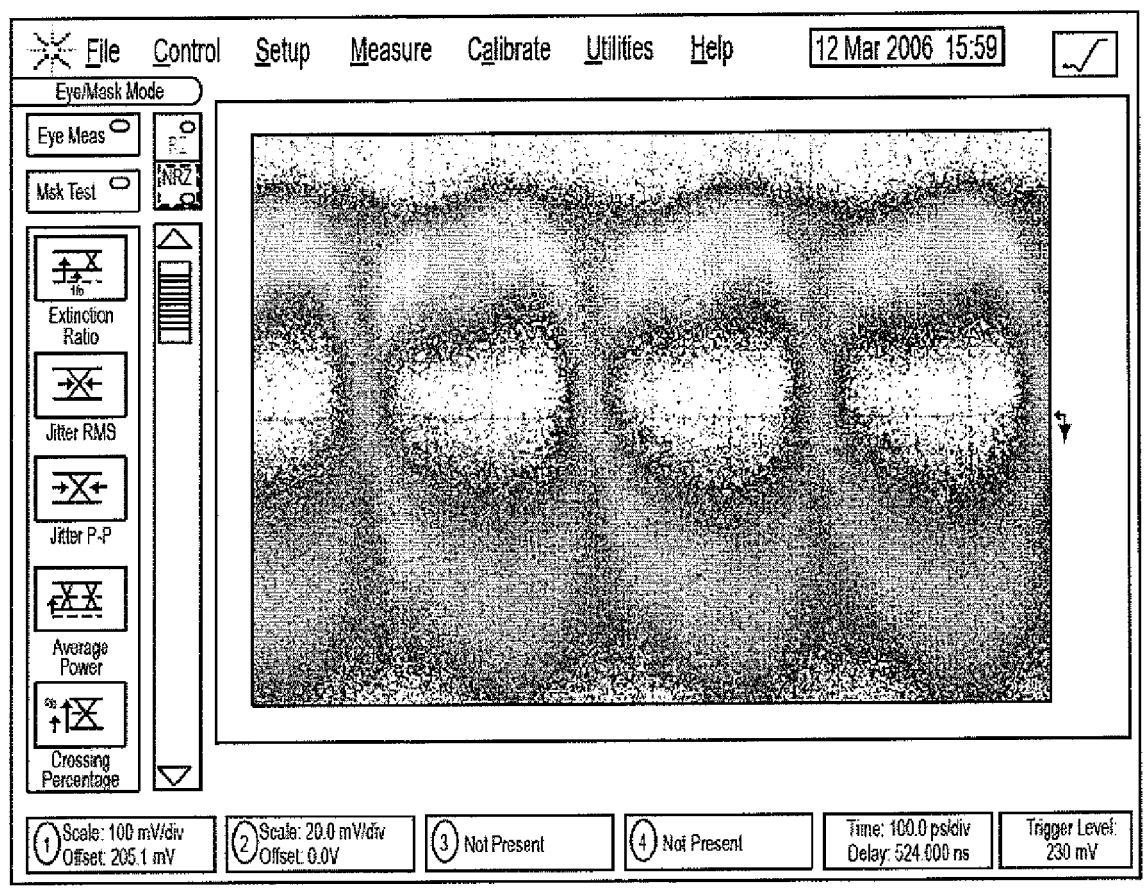
FIG. 9 is a screen shot of eye output of the 3.5 Gbps receiver of FIG. 8 with electrical input current.

Referring now to FIGS. 8 and 9, a schematic diagram of the receiver of FIG. 7 is shown in FIG. 8. It consists of transimpedance stage 40 (FIG. 8), and three gain stages 42-44 (FIG. 8). The first two gain stages, 42 (FIG. 8) and 43 (FIG. 8), are common-emitter amplifiers while the third stage 44 (FIG. 8) is a Cherry-Hooper stage. The receiver uses a low-voltage supply of 1.8V, consumes a power of 8 mW and has a data rate of 3.5 gbps as shown in output signal eye diagram of FIG. 9.

Figure 10:
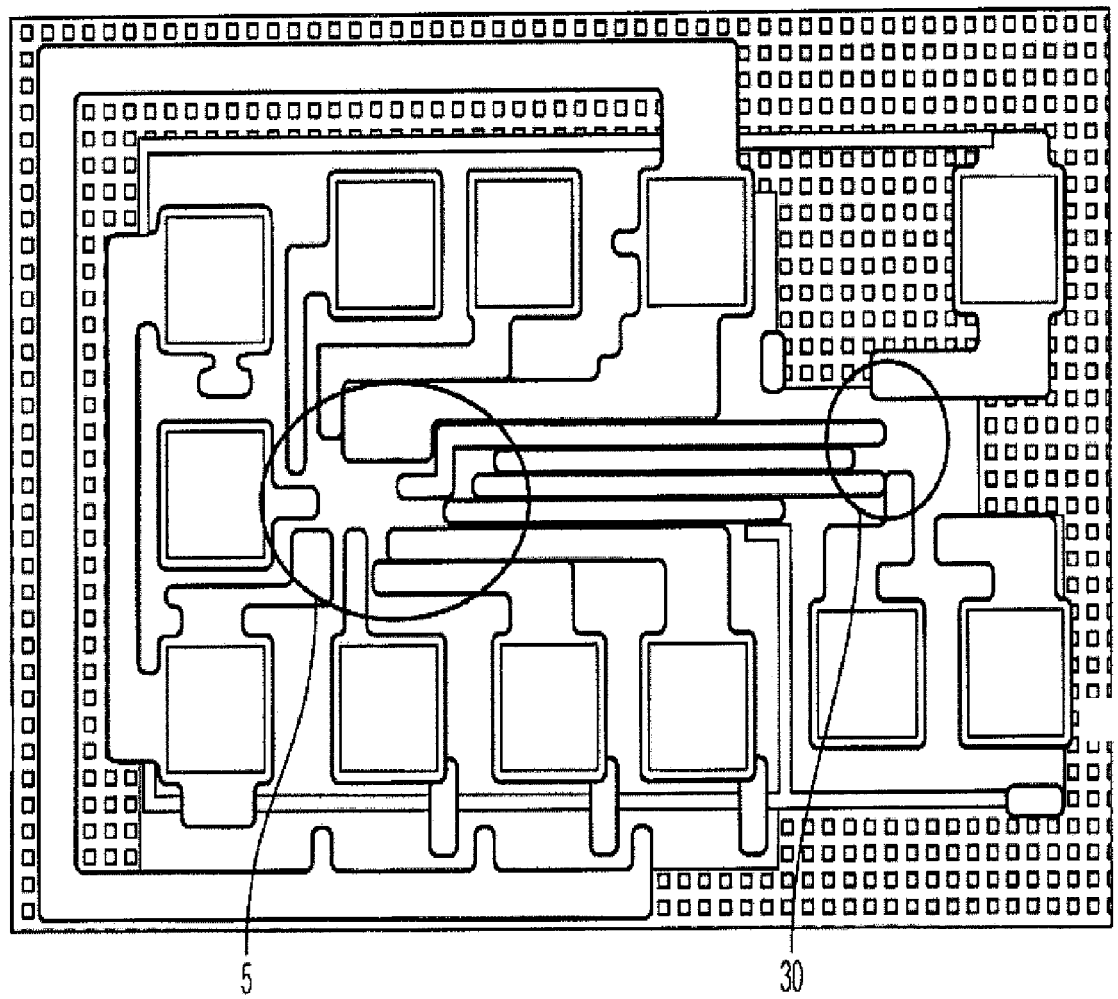
FIG. 10 is a pictorial representation of a chip picture of the integrated optical receiver.

Referring now to FIG. 10, layout of the integrated receiver is shown. The phototransistor 30 and the receiver 5 have been built on a lightly doped p-silicon substrate. Since the substrate absorbs near infra-red light, the circuit is covered with a layer of top metal and the phototransistor 30 and the receiver 5 are physically separated by around 300 μm to reduce the interaction between the incident light and the amplifier circuit.

Figure 11:
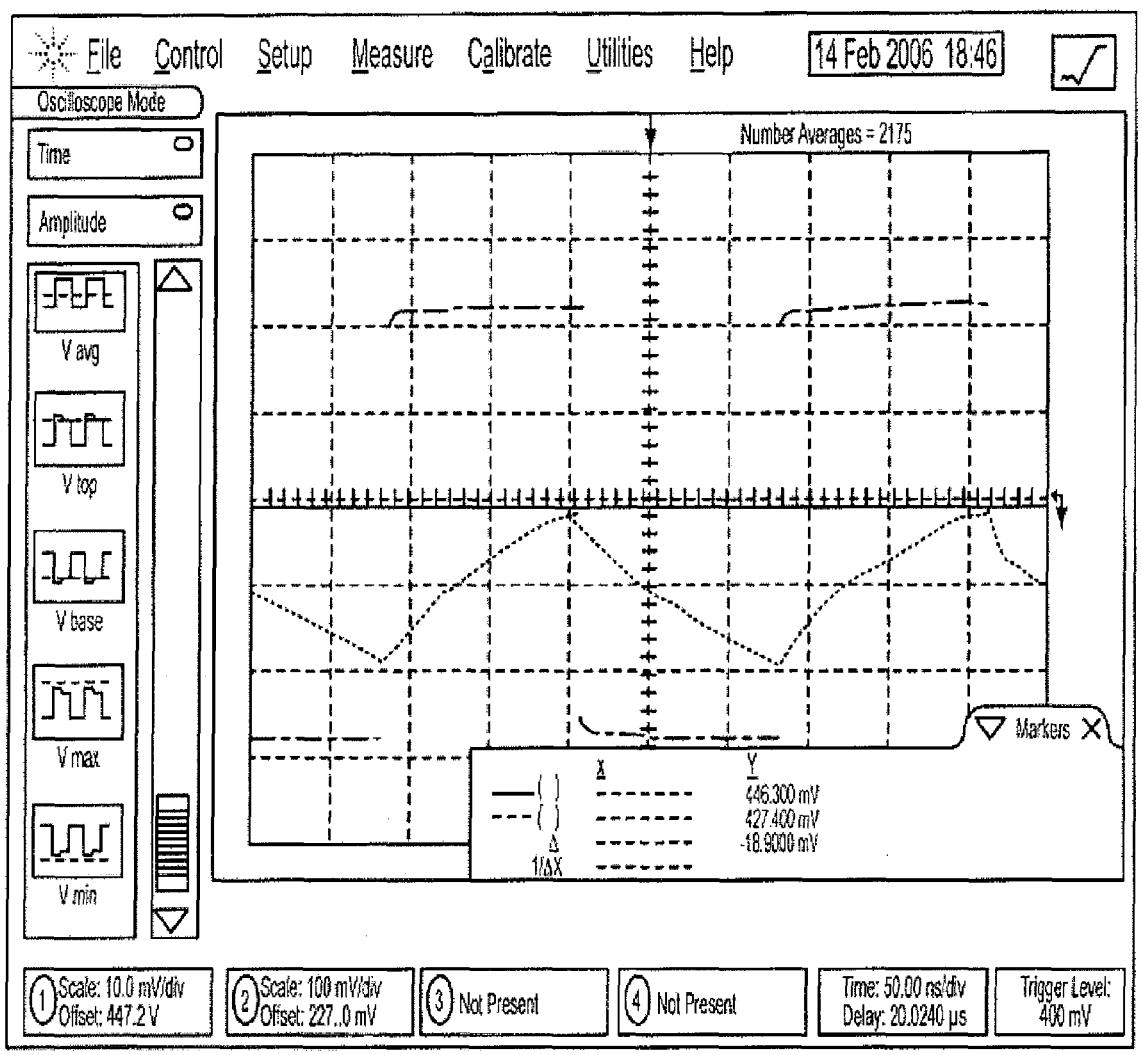
FIG. 11 is a screen shot of a diagram of receiver output signal at 4 MHz with a small but sharp rise and fall and RC behavior due to the two poles.
Figure 12:
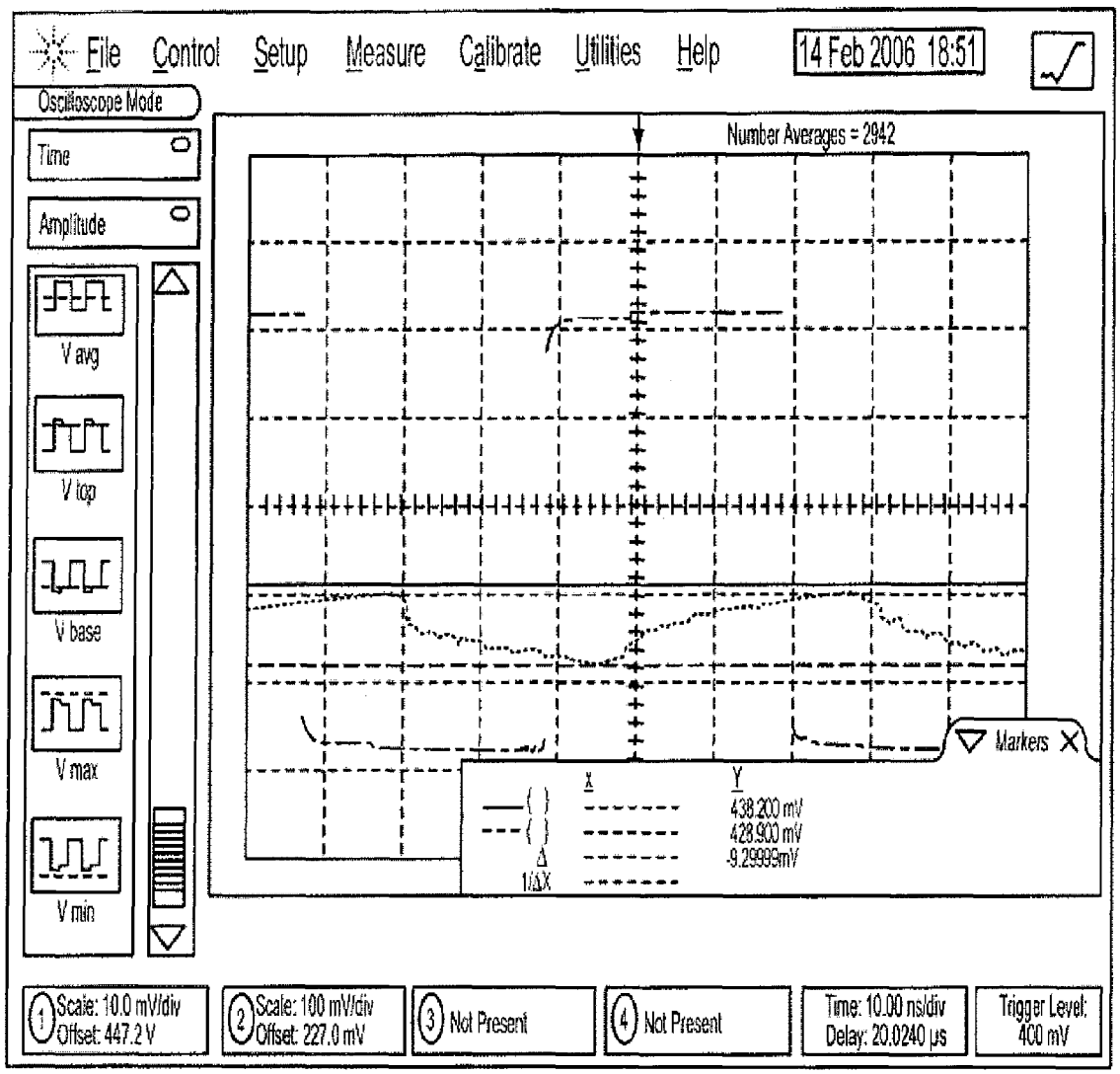
FIG. 12 is a screen shot of a diagram of a receiver output signal at 16 MHz, with a signal frequency in between the two poles.
Figure 13:
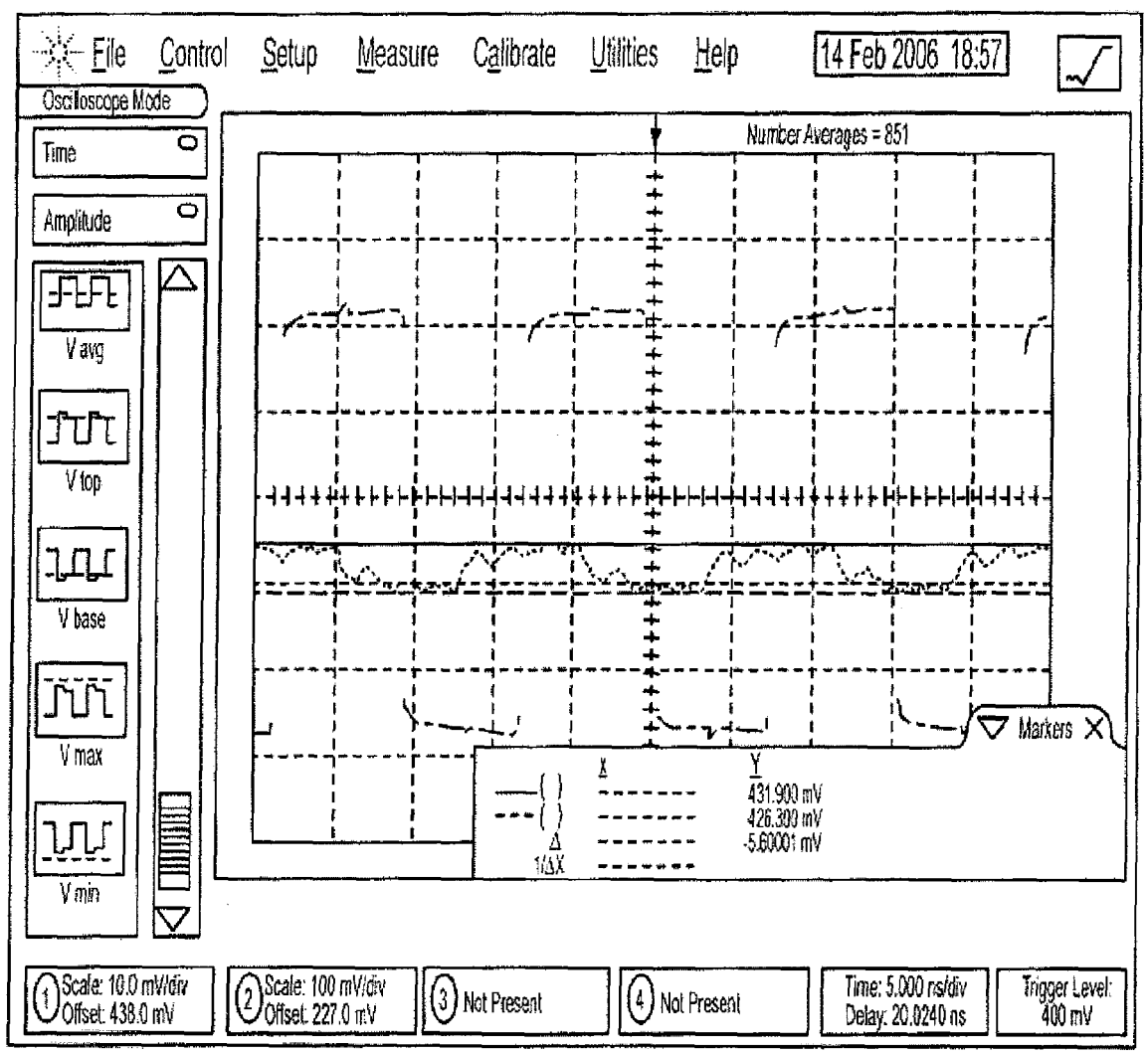
FIG. 13 is a screen shot of a diagram of a receiver output signal at 64 MHz, with a signal frequency far beyond the first pole and in the flat band between the two poles.

Referring now to FIGS. 11-13, when the integrated circuit of FIG. 10 was tested, the detector's output acted like the sum of two currents as shown in FIGS. 11-13. Each component of the total current has its own bandwidth pole. The first pole occurs at ¼ MHz and the other at ¼ GHz, as shown in FIGS. 11-13. The effect of the two poles can be seen as the modulating frequency of the input light is increased from 4 MHz to 64 MHz. At 4 MHz, the first pole dominates the response and the output looks like an RC response with small but fast rise and fall spikes. At 64 MHz, response due to the first pole dies down leaving the fast rise and fall spikes which can lead to good output waveforms.

Figure 14:
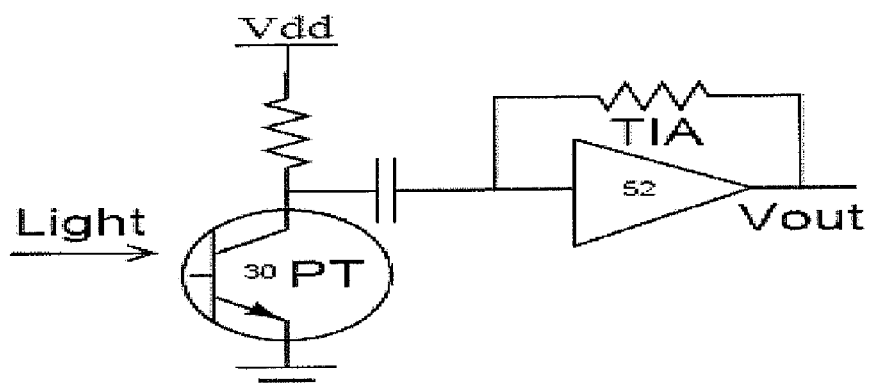
FIG. 14 is a block diagram of an integrated receiver with input AC coupling.
Figure 15:
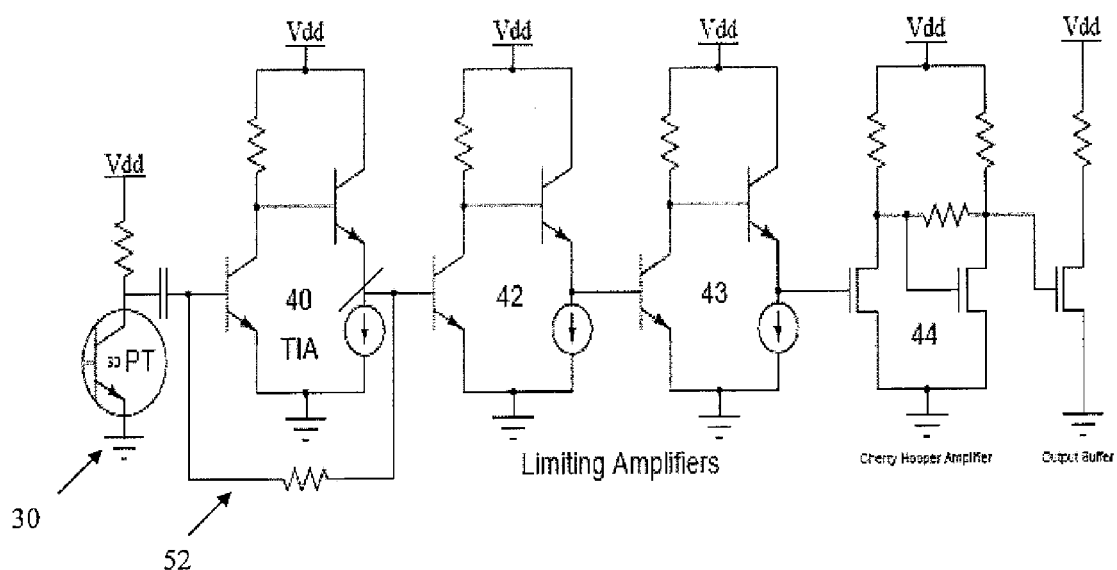
FIG. 15 is a schematic block diagram of the integrated receiver with input AC coupling of FIG. 14.

Referring now to FIGS. 14 and 15, behavior as described above is due to the collector-substrate junction acting as a low frequency pole. This p-n junction produces current when light is shone on it. But, the slow carrier movement from the substrate leads to a low frequency pole. The transistor amplification due to light absorption in the base leads to the high frequency pole. In order to demonstrate operation at high frequencies, the effect of the low frequency pole should be mitigated. This can be achieved using AC coupling at the input, as shown in FIG. 14. FIG. 15 is a schematic diagram of the circuit shown in FIG. 14.

Figure 16:
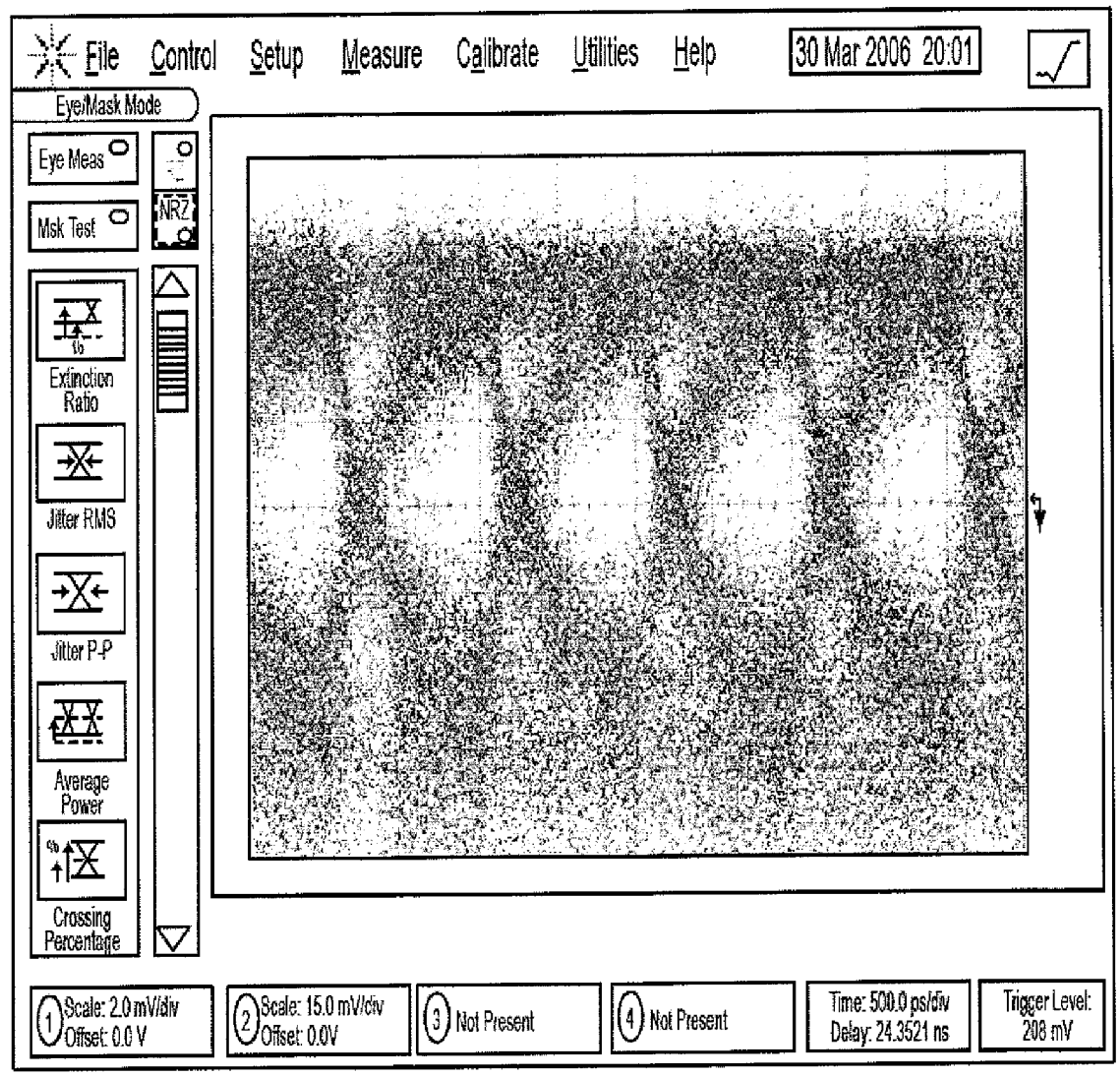
FIG. 16 is a screen shot of an output signal eye diagram at 1 Gbps.
Figure 17:
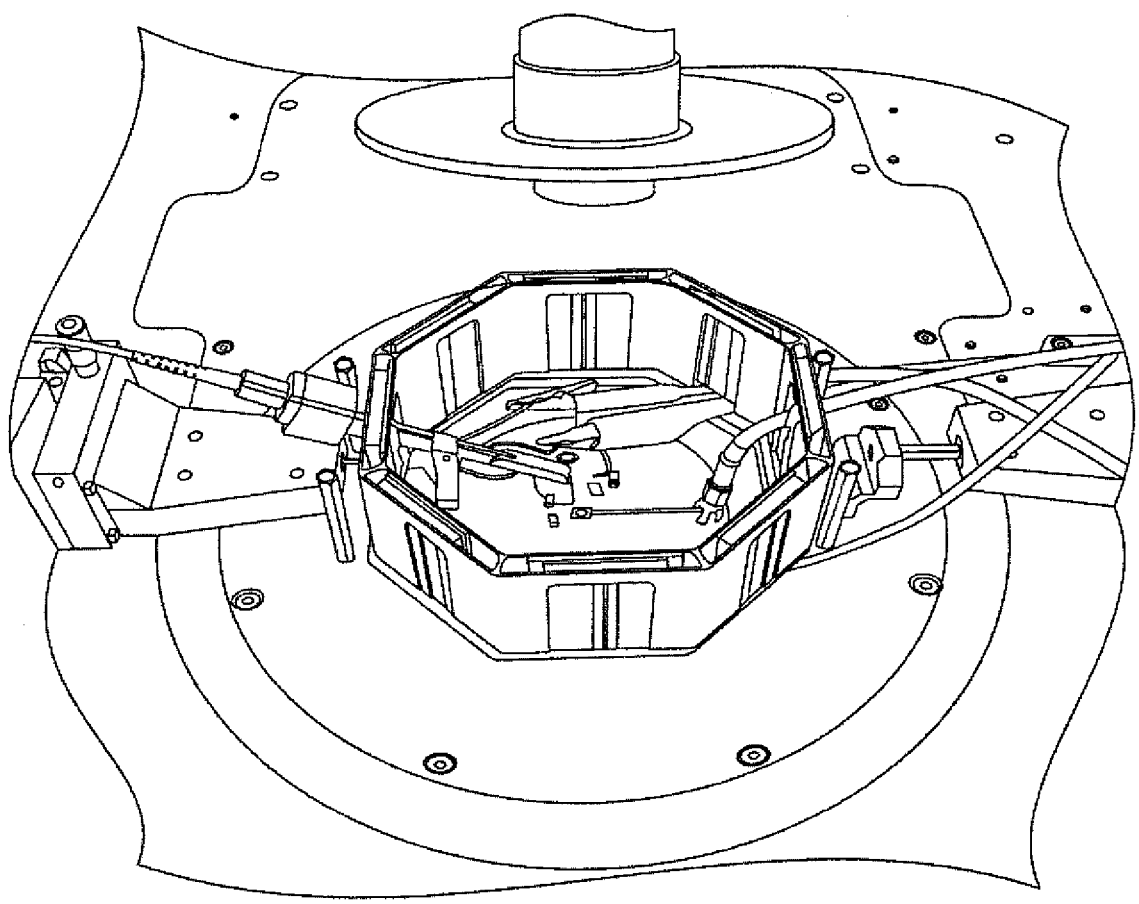
FIG. 17 is a photograph of a test setup for the circuits of FIGS. 14 and 15.

Referring now to FIGS. 16 and 17, data shown in the output signal eye diagram of FIG. 16 is obtained at 1 Gbps from the integrated receiver using the test setup of FIG. 17, wherein a lensed-fiber probe is used to vertically illuminate the phototransistor and generate carriers. Since, this high-speed output was obtained with a low supply voltage of 1.8V, the result represents a low supply voltage optoelectronic receiver that does not require process modifications. This result may be further improved in a variety of ways including: using a smaller sized detector and a high sensitivity TIA following it; reducing the noise in the output by reducing the value of the phototransistor bias resistor (20 k—in the present design); reducing the bandwidth of the TIA to the bandwidth of the detector to reduce the TIA noise; and biasing the base using a current source and moving the phototransistor into a high-fT region.

FIGS. 18-23 show circuit diagrams of several possible integrated receiver topologies designed for use with an integrated SiGe phototransistor. The amplifiers described can be generalized to any TIA and limiting voltage amplifier.

Figure 18:
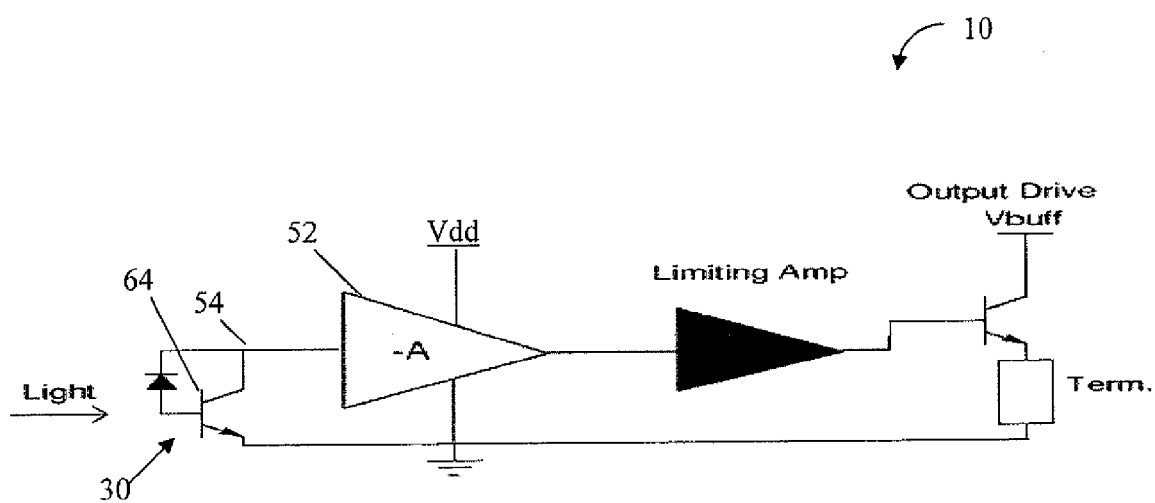
FIG. 18 is a block diagram of a general transimpedance amplifier (TIA) integrated with a SiGe phototransistor.

Referring now to FIG. 18, general TIA 52 is integrated with the SiGe phototransistor. Integrated circuit 10 can include, but is not limited to including, phototransistor 30 including base 64 having a SiGe base layer of a predetermined germanium composition and a thickness of more than 65 nm and less than about 90 nm, and general TIA 52 that can receive output 54 from phototransistor 30. Phototransistor 30 and general TIA 52 can be built on a silicon substrate, which can be a lightly doped silicon substrate.

Figure 19:
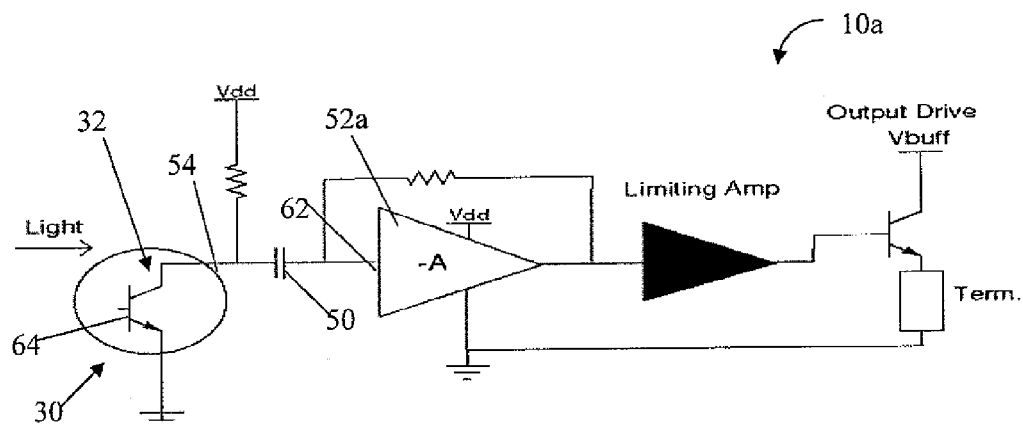
FIG. 19 is a block diagram of another topology for the circuit of FIG. 18.

Referring now primarily to FIG. 19 another topology, which has been demonstrated up to 1 Gbps, is shown. This topology includes AC coupling accomplished by capacitor 50 between phototransistor 30 and feedback TIA 52a, and a pre-bias stage with feedback TIA 52a. Capacitor 50 can be connected between collector 32 and input 62 to feedback TIA 52a. The same can be done with general TIA 52 (FIG. 18) as well. In feedback TIA integrated circuit 10a, output 54 of phototransistor 30 can be obtained from collector 32 of phototransistor 30.

Figure 20:
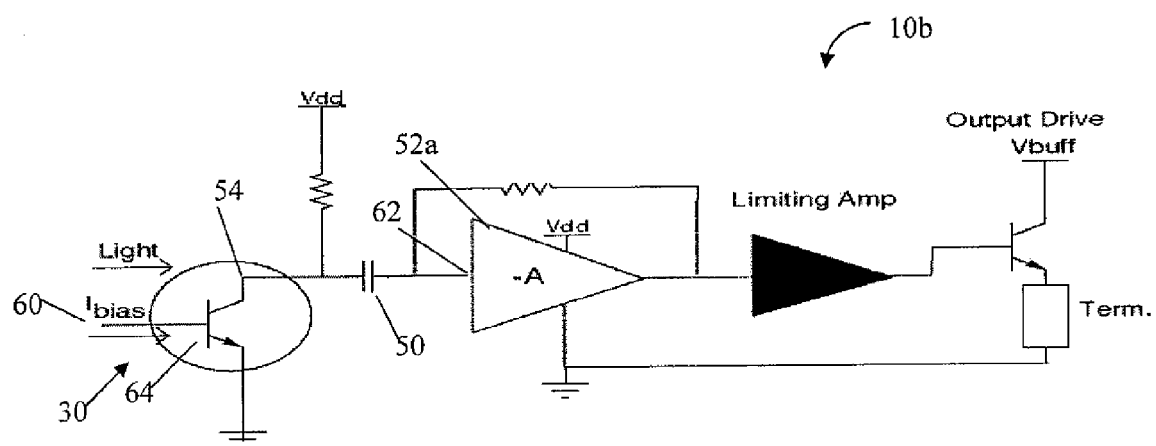
FIG. 20 is a block diagram of an improved version of the circuit of FIG. 19.

Referring now primarily to FIG. 20, feedback TIA 52a (FIG. 19) can be further improved in bias integrated circuit 10b with a current bias 60 supplied to base 64 of phototransistor 30 to improve the response such that it is biased in a high speed operating regime. The current source could be on the integrated CMOS chip for reduced interference.

Figure 21:
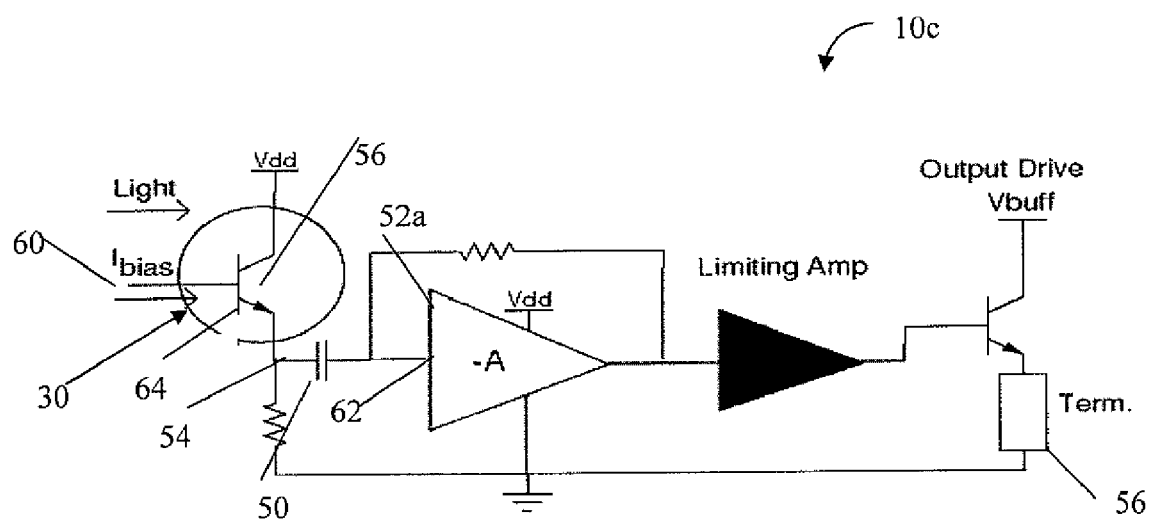
FIG. 21 is a block diagram of a further improved version of the circuit of FIG. 19.

Referring now to FIG. 21, improved response integrated circuit 10c a further topology is shown which can allow phototransistor 30 to have improved response, when the collector substrate junction injects a noisy and slow response, by coupling current through emitter 56. Output 54 of phototransistor 30 can be obtained from emitter 56 of phototransistor 30. This can be done with or without AC coupling, however bias control may be more straightforward with AC coupling through capacitor 50 connected between emitter 56 and input 62 to feedback TIA 52a.

Figure 22:
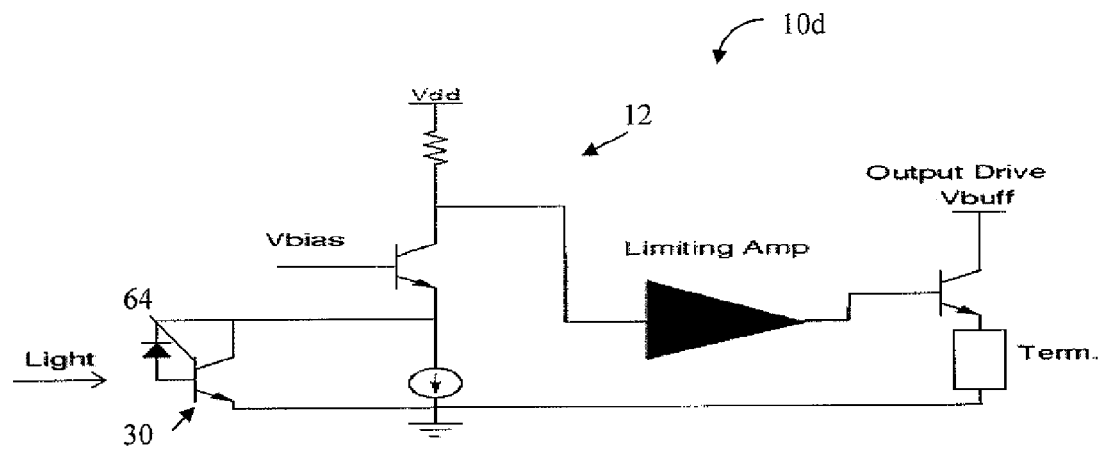
FIG. 22 is a block diagram of a similar circuit using a feed-forward topology.

Referring now to FIG. 22, the improved response integrated circuit 10c of FIG. 21 can also be used with feedforward TIA 12 in feed-forward integrated circuit 10d. (While one configuration of a feedforward TIA is shown in FIG. 22, these teachings are not limited only to that configuration. Any of the various conventional feed-forward TIA configurations could be used in these teachings. See, for example, but not limited to, Kromer, C.; Sialm, G.; Morf, T.; Schmatz, M. L.; Ellinger, F.; Emi, D.; Jackel, H, *A low-power 20-GHz 52-dB/spl Omega/transimpedance amplifier in 80-nm CMOS*, IEEE Journal of Solid-State Circuits, Volume 39, Issue 6, Date: June 2004, Pages: 885-894, incorporated by reference herein in its entirety.) The circuit can be constructed using bipolar devices, NFets, PFets, emitter coupling, and/or collector coupling.

Figure 23:
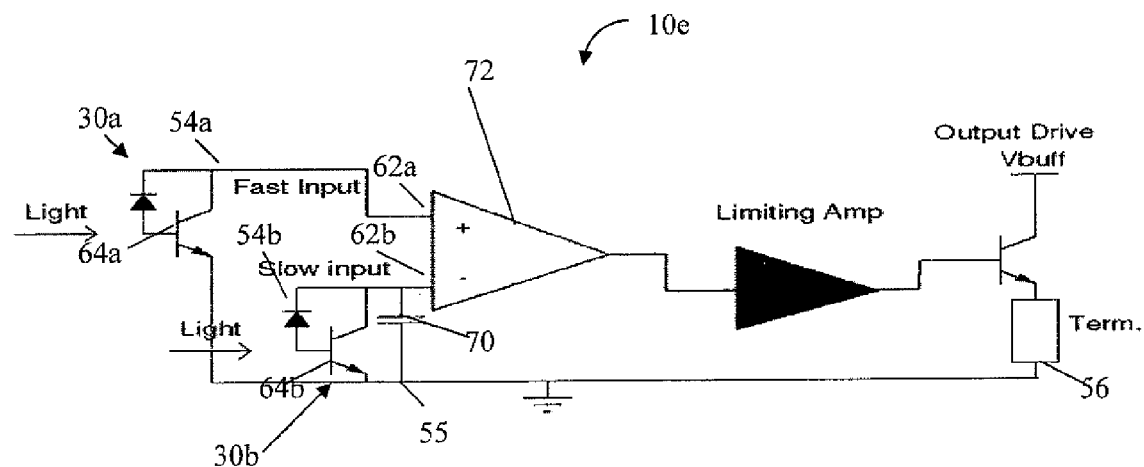
FIG. 23 is a block diagram of a circuit showing an alternative to AC coupling.

Referring now to FIG. 23, an alternative to AC coupling which can include filtering out the slow signal response in the phototransistor using a pseudo-differential topology is shown in filtering integrated circuit 10e. (The embodiment shown in FIG. 23 can be utilized in a method for improving frequency response of an integrated photonic receiver of these teachings.) In this topology, two identical phototransistors, either emitter or collector coupled, can be used, and one signal path can be slowed down using additional capacitor 70 or other filtering technique (the filtering technique or the filter to obtain a slow signal is referred to as a substantially low pass filter). The slow and fast responses are then combined using either current or voltage mode addition to build a differential band pass filter. This topology can be generalized further to a current mode circuit as well. In detail, filtering integrated circuit 10e can include, but is not limited to including, first phototransistor 30a, second phototransistor 30b, additional capacitor 70, and differential amplifier 72. First phototransistor 30a can include, but is not limited to including, first base 64a having a SiGe base layer of a predetermined germanium composition and a thickness of more than 65 nm and less than about 90 nm. Second phototransistor 30b can include, but is not limited to including, second base 64b having a SiGe base layer of the predetermined germanium composition and the thickness of more than 65 nm and less than about 90 nm. Additional capacitor 70 can be connected between second output 54b of second phototransistor 30b and ground 55. Differential amplifier 72 can receive first input 62a from first phototransistor 30a and second input 62b of second phototransistor 30b. First phototransistor 30a, second phototransistor 30b, and differential amplifier 72 can be built on a silicon substrate, which can be a lightly doped silicon substrate.

Referring now to FIGS. 18-22, a method for building an integrated circuit 10 (FIG. 18) using a conventional BiCMOS process can include, but is not limited to including, the steps of manufacturing phototransistor 30 (FIG. 18) having base 64 (FIG. 18) including an SiGe base layer of a pre-determined germanium composition and a thickness of more than 65 nm and less than about 90 nm, coupling general TIA 52 (FIG. 18) (or feedback TIA 52a (FIG. 19) or feed-forward TIA 12 (FIG. 22)) to phototransistor 30 (FIG. 18), general TIA 52 (FIG. 18)

(or feedback TIA 52a (FIG. 19) or feed-forward TIA 12 (FIG. 22)) to receive output 54 (FIG. 18) from phototransistor 30 (FIG. 18), and configuring phototransistor 30 (FIG. 18) and general TIA 52 (FIG. 18) (or feedback TIA 52a (FIG. 19) or feed-forward TIA 12 (FIG. 22)) on a silicon substrate. The method can further include the step of obtaining output 54 (FIG. 18) of phototransistor 30 (FIG. 18) from collector 32 (FIG. 19) of phototransistor 30 (FIG. 18). The method can still further include the step of configuring capacitor 50 (FIG. 19) between collector 32 (FIG. 19) and input 62 (FIG. 19) to general TIA 52 (FIG. 18) (or feedback TIA 52a (FIG. 19) or feed-forward TIA 12 (FIG. 22)). The method can even still further include the step of supplying current bias 60 (FIG. 20) to base 64 (FIG. 18) of phototransistor 30 (FIG. 18). The method can further include the step of obtaining output 54 (FIG. 18) of phototransistor 30 (FIG. 18) from emitter 56 (FIG. 21) of phototransistor 30. The method can further include the step of configuring capacitor 50 (FIG. 21) between emitter 56 (FIG. 21) and input 62 (FIG. 21) to general TIA 52 (FIG. 18) (or feedback TIA 52a (FIG. 19) or feed-forward TIA 12 (FIG. 22)).

Referring now to FIG. 23, an alternative method for building integrated circuit 103 using a conventional BiCMOS process can include, but is not limited to including the steps of manufacturing first phototransistor 30a having first base 64a including an SiGe base layer of a pre-determined germanium composition and a thickness of more than 65 nm and less than about 90 nm, manufacturing second phototransistor 30b having second base 64b including an SiGe base layer of a pre-determined germanium composition and a thickness of more than 65 nm and less than about 90 nm, configuring additional capacitor 70 between second output 54b of second phototransistor 30b and ground 55, receiving first output 54a from first phototransistor 30a and second output 54b of second phototransistor 30b into differential amplifier 72, configuring first phototransistor 30a, second phototransistor 30b, and differential amplifier 72 on a silicon substrate.

Figure 24:
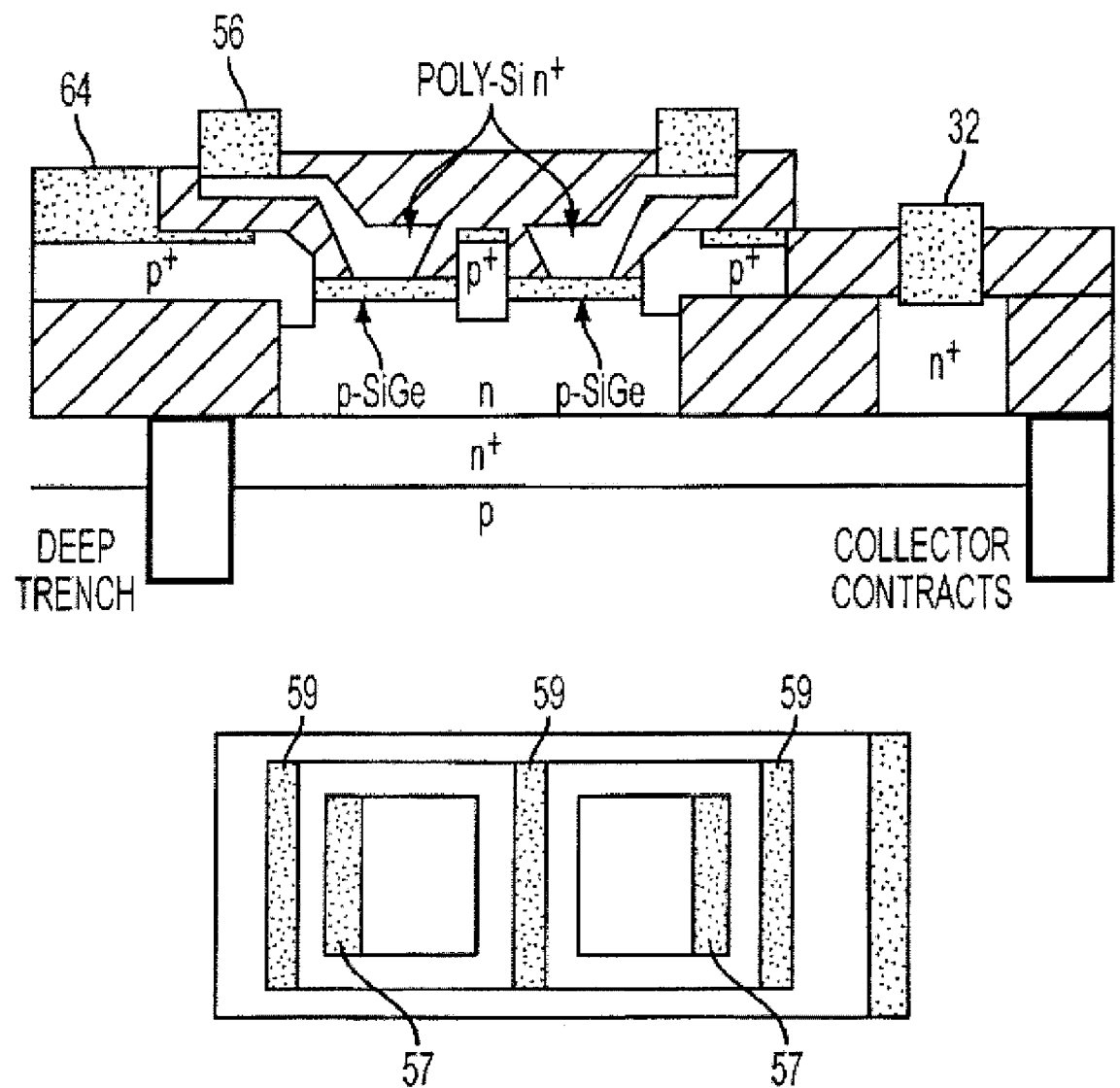
FIG. 24 is a graphical schematic cross-sectional and top view of a SiGe phototransistor of these teachings.

Referring now to FIG. 24, gain bandwidth product of the HPT can be optimized in part by controlled biasing of base 64 to ensure operation in a high fT region. In phototransistors with a large active area for absorption, parasitics can limit device bandwidth. In addition, base current spreading from the device edge to the center can reduce the effective voltage drop across the device and can cause a reduction in current gain. Interdigitated contacts to make two-finger devices as shown in FIG. 24 can reduce these effects. Emitter 56 can be cut into two areas 57 with separate contacts 59 and spacing between of, for example, 1 μm. This embodiment can avoid reducing the total emitter area. Phototransistors with 6×10 μm active areas and two-finger structure can be fabricated, as well as devices with 5×5 μm active area without finger design, and 2×2 μm devices with finger design. Smaller devices can suffer the least degradation of bandwidth, but they can also present a challenge in optical coupling and alignment. This challenge can be overcome with, for example, waveguide-based coupling structures.

The results on detector-receiver integration in a commercial technology form an important step towards realization of opto-electronic systems. Integration in commercial technologies and elimination of post-processing steps can diminish the differences between design and tape-out of completely electronic and opto-electronic circuits. With adequate detector simulation models, the opto-electronic detector and receiver can be designed and optimized together at the design phase. This integration may simplify implementation of optical fanout. Another feature of this solution, low voltage supply, can aid in reducing the complexity of optical fanout systems by eliminating additional power supplies and reducing cost. Such integrated systems can be low-cost alternatives to electronic interconnects in slip ring systems such as, for example, MRIs, and in imaging systems such as, for example, HDTVs.

Although various embodiments have been described, it should be realized that a wide variety of further and other embodiments are possible.

What is claimed is:

1. A method for building an integrated circuit using a conventional BiCMOS process, the conventional BiCMOS process comprising extensive use of planarization techniques, the method comprising the steps of:
    manufacturing, using the conventional BiCMOS process, a phototransistor having a base including an SiGe base layer of a pre-determined germanium composition and a thickness of more than 65 nm and less than about 90 nm; said phototransistor being comprised of a number of active regions, each active region, except a bottom active region, vertically disposed over another active region;
    coupling a transimpedance amplifier (TIA) to the phototransistor;
    configuring the TIA to receive an output directly from the phototransistor;
    configuring a capacitor between a collector of the phototransistor and an input to the TIA;
    said capacitor reducing an effect of collector-substrate junction on bandwidth; and
    configuring the phototransistor and the TIA on a silicon substrate.

2. The method of claim 1 further comprising the step of:
    obtaining-the output of the phototransistor from a collector of the phototransistor.

3. The method of claim 1 further comprising the step of:
    supplying a current bias to the base of the phototransistor.

4. The method of claim 3 further comprising the step of:
    obtaining the output of the phototransistor from the collector of the phototransistor.

5. The method of claim 3 further comprising the step of:
    obtaining the output of the phototransistor from an emitter of the phototransistor.

6. The method of claim 5 further comprising the step of:
    configuring a capacitor between the emitter and an input to the TIA.

7. A method for building an integrated circuit using a conventional BiCMOS process the conventional BiCMOS process comprising extensive use of planarization techniques, the method comprising the steps of:
    Manufacturing, using the conventional BiCMOS process, a first phototransistor having a first base including an SiGe base layer of a pre-determined germanium composition and a thickness of more than 65 nm and less than about 90 nm; said first phototransistor being comprised of a number of active regions, each active region, except a bottom active region, vertically disposed over another active region;
    Manufacturing, using the conventional BiCMOS process, a second phototransistor having a second base including an SiGe base layer of a pre-determined germanium composition and a thickness of more than 65 nm and less than about 90 nm; said second phototransistor being comprised of a number of active regions, each active region vertically disposed over another active region;
    configuring a capacitor between a second output of the second phototransistor and a ground;

receiving a first output from the first phototransistor and the second output of the second phototransistor into a differential amplifier;

configuring the first phototransistor, the second phototransistor, and the differential amplifier on a silicon substrate.

8. A method for improving bandwidth of a photonic receiver, the method comprising the steps of:

manufacturing, on a silicon substrate, a phototransistor having a base including an SiGe base layer of a pre-determined germanium composition and a thickness of more than 65 nm and less than about 90 nm; said phototransistor being comprised of a number of active regions, each active region, except a bottom active region, vertically disposed over another active region;

manufacturing, on said silicon substrate, a transimpedance amplifier (TIA) configured to achieve a predetermined bandwidth; and configuring a capacitor to reduce an effect of collector-substrate junction on bandwidth; the capacitor being configured between an output of the phototransistor and an input of the TIA, the capacitor connecting the output of the phototransistor to the input of the TIA;

obtaining, by said manufacturing steps and said configuring, a photonic receiver with improved bandwidth.

9. The method of claim 8 further comprising the steps of:

providing a current bias to the base of the phototransistor; and obtaining the output of the phototransistor from a common emitter mode of operation.

10. A method for improving a bandwidth of a photonic receiver, the method comprising the steps of:

manufacturing, on a silicon substrate, a first phototransistor having a first base including an SiGe base layer of a pre-determined germanium composition and a thickness of more than 65 nm and less than about 90 nm; said first phototransistor being comprised of a number of active regions, each active region, except a bottom active region, vertically disposed over another active region;

manufacturing, on the silicon substrate, a second phototransistor having a second base including an SiGe base layer of a pre-determined germanium composition and a thickness of more than 65 nm and less than about 90 nm; said second phototransistor being comprised of a number of active regions, each active region, except a bottom active region, vertically disposed over another active region;

manufacturing, on the silicon substrate, a differential amplifier;

connecting a first output of the first phototransistor to a first input of the differential amplifier;

filtering a second output of the second phototransistor with a substantially low pass filter, thereby obtaining a filtered output and connecting the filtered output of the second phototransistor to a second input of the differential amplifier;

obtaining, by said manufacturing steps, said configuring steps and said connecting, a photonic receiver with improved bandwidth is obtained.

11. The method of claim 10 further comprising the steps of:

providing a first current bias to the first base of the first phototransistor;

obtaining the first output of the first phototransistor from a common emitter mode of operation;

providing a second current bias to the second base of the second phototransistor; and obtaining the second output of the second phototransistor from a common emitter mode of operation.

* * * * *

UNITED STATES PATENT AND TRADEMARK OFFICE
CERTIFICATE OF CORRECTION

PATENT NO. : 8,062,919 B2  
APPLICATION NO. : 11/837222  
DATED : November 22, 2011  
INVENTOR(S) : Alyssa B. Apsel et al.

Page 1 of 1

It is certified that error appears in the above-identified patent and that said Letters Patent is hereby corrected as shown below:

In column 8, line 34 (claim 2), "obtaining-the output" should read --obtaining the output--
In column 8, line 48 (claim 7), "process the conventional" should read --process, the conventional--
In column 8, line 51 (claim 7), "Manufacturing," should read --manufacturing--
In column 8, line 59 (claim 7), "Manufacturing," should read --manufacturing--
In column 10, line 19 (claim 10), "output and" should read --output; and--
In column 10, line 24 (claim 10), "bandwidth is obtained." should read --bandwidth.--

Signed and Sealed this
Sixth Day of March, 2012

David J. Kappos
*Director of the United States Patent and Trademark Office*